(12) United States Patent
Bhat et al.

(10) Patent No.: US 9,569,863 B2
(45) Date of Patent: Feb. 14, 2017

(54) SYSTEM FOR ACCELERATED SEGMENTED MR IMAGE DATA ACQUISITION

(71) Applicants: Himanshu Bhat, Cambridge, MA (US); Jonathan Rizzo Polimeni, Cambridge, MA (US)

(72) Inventors: Himanshu Bhat, Cambridge, MA (US); Jonathan Rizzo Polimeni, Cambridge, MA (US)

(73) Assignees: Siemens Healthcare GmbH, Erlangen (DE); The General Hospital Corporation, Boston, MA (US)

( * ) Notice: Subject to any disclaimer, the term of this patent is extended or adjusted under 35 U.S.C. 154(b) by 300 days.

(21) Appl. No.: 13/958,658

(22) Filed: Aug. 5, 2013

(65) Prior Publication Data

US 2014/0037171 A1   Feb. 6, 2014

Related U.S. Application Data

(60) Provisional application No. 61/679,852, filed on Aug. 6, 2012.

(51) Int. Cl.
*G06T 11/00* (2006.01)
*G01R 33/561* (2006.01)

(52) U.S. Cl.
CPC ......... *G06T 11/003* (2013.01); *G01R 33/5611* (2013.01); *G01R 33/5616* (2013.01)

(58) Field of Classification Search
None
See application file for complete search history.

(56) References Cited

U.S. PATENT DOCUMENTS

| | | | | |
|---|---|---|---|---|
| 4,748,409 A | * | 5/1988 | Frahm | G01R 33/4833 324/307 |
| 6,434,413 B1 | * | 8/2002 | Liu | G01R 33/56 324/307 |
| 2003/0144587 A1 | * | 7/2003 | Ma | G01R 33/4838 600/410 |
| 2005/0001619 A1 | * | 1/2005 | Kiefer | G01R 33/56563 324/309 |
| 2007/0063704 A1 | * | 3/2007 | Peters | G01R 33/56554 324/309 |
| 2010/0264924 A1 | * | 10/2010 | Stemmer | G01R 33/56375 324/309 |
| 2012/0257806 A1 | * | 10/2012 | Sheltraw | A61B 5/055 382/131 |
| 2012/0259199 A1 | * | 10/2012 | Huwer | G01R 33/56341 600/410 |

* cited by examiner

*Primary Examiner* — Siamak Harandi
*Assistant Examiner* — Mai Tran

(57) ABSTRACT

A system for accelerated segmented magnetic resonance (MR) image data acquisition includes an RF (Radio Frequency) signal generator and a magnetic field gradient generator. The RF signal generator generates RF excitation pulses in anatomy and enabling subsequent acquisition of associated RF echo data. The magnetic field gradient generator generates magnetic field gradients for anatomical volume selection, phase encoding, and readout RF data acquisition in a three dimensional (3D) anatomical volume. The RF signal generator and the magnetic field gradient generator acquire consecutive segments of k-space line data representative of an individual image slice in a gradient echo method by adaptively varying RF excitation pulse flip angle between acquisition of the consecutive segments.

20 Claims, 6 Drawing Sheets

Prior Art
Consecutive Slice reference
scan acquisition

System
Consecutive Segment reference
scan acquisition, α=5°

603
No Motion

605
With Motion

SYSTEM FOR ACCELERATED SEGMENTED MR IMAGE DATA ACQUISITION

CROSS-REFERENCE TO RELATED APPLICATIONS

This application claims priority to U.S. provisional application Ser. No. 61/679,852 filed Aug. 6, 2012, which is incorporated herein by reference in its entirety.

GOVERNMENTAL RIGHTS

This invention was made with government support under grant numbers NIBIB K01-EB011498 and NCRR P41-RR14075 awarded by the NIH. The government has certain rights in the invention.

FIELD OF THE INVENTION

This invention relates generally to a system for accelerated segmented magnetic resonance (MR) echo-planar image data acquisition by acquiring consecutive segments of k-space line data representative of an individual image slice consecutively in a gradient echo method, for example, by adaptively varying method of acquisition of consecutive segments.

BACKGROUND OF THE INVENTION

Echo planar imaging (EPI) is a magnetic resonance (MR) imaging technique capable of acquiring an entire MR image in short amount of time compared to other conventional MR techniques. While conventional MR techniques progressively generate an image from a series of sequentially acquired readout lines, EPI obtains multiple lines of spatially-encoded data of an image after a single excitation, either in a gradient echo or spin echo pulse sequence. This excitation is commonly referred to as a "shot" by those skilled in the art. When EPI is used to acquire all lines of an image after one shot, it is commonly referred to as a "single-shot EPI" acquisition.

Conventional systems apply accelerated parallel imaging technique to EPI acquisitions to reduce a number of phase encoding steps and therefore to reduce a total readout time and echo spacing. In turn, this decreases image blur and geometric distortion artifacts caused by off-resonance effects. A GRAPPA (Generalized Autocalibrating Partially Parallel Acquisition) accelerated parallel imaging method is used in conventional systems for image reconstruction due to its use of reference autocalibration data to facilitate image reconstruction, rather than use of explicit coil sensitivity profiles. Although GRAPPA is somewhat insensitive to image contrast contained in the reference autocalibration data, typically the acquisition of the reference autocalibration data is performed so as to match echo spacing of image data so that geometric distortions present in the image data are also present in the autocalibration data.

In order to match the echo spacings between the image data and the reference data, conventional imaging systems employ a multi-shot or segmented EPI acquisition for k-space reference line acquisition. For time efficiency in multi-slice acquisitions, segmented reference lines are acquired in a consecutive-slice manner in which a first segment is acquired across slices in a collection of acquired slices, followed by a second segment and so on. This causes a time interval between the adjacent segments within a given slice to be a function of the number of slices and the repetition time, TR. This interval can be, for example, between 2 to 10 seconds for standard imaging protocols. A difficulty of this method is that a misalignment between adjacent segments of the reference line acquisition leads to pronounced image artifacts in GRAPPA reconstructed images. Misalignment occurs if, for example, a patient moves during an interval between segments. Furthermore, because changes in breathing or respiration affect the EPI data, if the adjacent segments of the reference line acquisition are acquired during different phases of the respiratory or cardiac cycles this introduces errors into the GRAPPA training that propagate into artifacts in the final image reconstruction.

SUMMARY OF THE INVENTION

Embodiments of the present invention address and overcome one or more of the above shortcomings and drawbacks, by providing methods, systems, and apparatuses which accelerates segmented magnetic resonance (MR) image data acquisition. Briefly stated, a RF signal generator and a magnetic field gradient generator acquire all segments of k-space line data representative of an individual image slice in a gradient echo method consecutively in time by adaptively varying RF excitation pulse flip angle between the acquisition of consecutive segments.

Some embodiments of the present invention are directed to system for accelerated segmented magnetic resonance (MR) image data acquisition comprises an RF (Radio Frequency) signal generator and a magnetic field gradient generator. The RF signal generator generates RF excitation pulses in anatomy, enabling subsequent acquisition of associated RF echo data. The magnetic field gradient generator generates magnetic field gradients for anatomical volume selection, phase encoding, and readout RF data acquisition in a three dimensional (3D) anatomical volume. The RF signal generator and the magnetic field gradient generator acquire consecutive segments of k-space line data representative of an individual image slice in a gradient echo method by adaptively varying RF excitation pulse flip angle between acquisition of the consecutive segments.

According to one aspect of the present invention, the consecutive segments comprise consecutive segments of calibration k-space line data, and the RF signal generator and the magnetic field gradient generator acquire the consecutive segments in a parallel imaging method. In some embodiments, these consecutive segments of calibration k-space line data may be consecutive for the individual image slice and interleaved in k-space. In one embodiment, the RF signal generator and the gradient generator may acquire additional consecutive segments of calibration k-space line data representative of successive consecutive individual image slices. In one embodiment, the RF signal generator and the gradient generator may acquire additional consecutive segments of calibration k-space line data representative of successive individual image slices. In some embodiments, the parallel imaging method is a GRAPPA (Generalized Autocalibrating Partially Parallel Acquisition) accelerated parallel imaging method and the calibration k-space line data comprises auto-calibration k-space line data of the GRAPPA accelerated parallel imaging method.

According to another aspect of the invention, the RF signal generator provides three RF pulses of varying RF excitation pulse flip angle for acquisition of three consecutive segments comprising the individual image slice, the RF excitation pulse flip angle comprising flip angles of 35.1 degrees for segment 1, 45 degrees for segment 2, and 90 degrees for segment 3. In some embodiments, the system calculates flip angle for acquisition of the consecutive segments such that an applied RF excitation signal is substantially equal for acquisition of each consecutive segment included in the consecutive segments.

Other embodiments of the present invention are directed to system for accelerated segmented magnetic resonance (MR) image data acquisition, comprising: an RF (Radio Frequency) signal generator for generating RF excitation pulses in anatomy and enabling subsequent acquisition of associated RF echo data; and a magnetic field gradient generator for generating magnetic field gradients for anatomical volume selection, phase encoding and readout RF data acquisition in a three dimensional (3D) anatomical volume. In these embodiments, the RF signal generator and the magnetic field gradient generator acquire consecutive segments of k-space line data representative of an individual image slice in a spin echo method using a first RF excitation pulse 90 degree flip angle, followed by 180 degree refocusing pulses to form spin-echoes for each segment comprising the individual image slice. In some embodiments, the consecutive segments comprise consecutive segments of calibration k-space line data and the consecutive segments are acquired by the RF signal generator and the gradient generator in a parallel imaging method. The RF signal generator and the gradient generator may acquire additional consecutive segments of calibration k-space line data of successive consecutive individual image slices. The RF signal generator and the gradient generator may also or alternatively acquire additional consecutive segments of calibration k-space line data of successive individual image slices. In some embodiments, the parallel imaging method is a GRAPPA (Generalized Autocalibrating Partially Parallel Acquisition) accelerated parallel imaging method and the calibration k-space line data comprises auto-calibration k-space line data of the GRAPPA accelerated parallel imaging method. The consecutive segments of calibration k-space line data may be consecutive for the individual image slice and interleaved in k-space.

Other embodiments of the present invention are directed to system for accelerated segmented magnetic resonance (MR) image data acquisition, comprising an RF (Radio Frequency) signal generator for generating RF excitation pulses in anatomy and enabling subsequent acquisition of associated RF echo data; and a magnetic field gradient generator for generating magnetic field gradients for anatomical volume selection, phase encoding and readout RF data acquisition in a three dimensional (3D) anatomical volume. In these embodiments, the RF signal generator and the gradient generator acquire consecutive segments of k-space line data representative of an individual image slice in a gradient echo method by using substantially the same flip angle value for acquisition of the consecutive segments.

Other embodiments of the present invention are directed to a method for accelerated segmented MR image data acquisition. This method includes using an RF signal generator for generating RF excitation pulses in anatomy and enabling subsequent acquisition of associated RF echo data; and using a magnetic field gradient generator for generating magnetic field gradients for anatomical volume selection, phase encoding and readout RF data acquisition in a 3D anatomical volume. In the method, the RF signal generator and the gradient generator acquire consecutive segments of k-space line data representative of an individual image slice in a gradient echo method by adaptively varying RF excitation pulse flip angle between acquisition of the consecutive segments. In some embodiments, the consecutive segments comprise consecutive segments of calibration k-space line data, and the RF signal generator and the magnetic field gradient generator acquire the consecutive segments in a parallel imaging method. In some embodiments, the method further includes acquiring additional consecutive segments of calibration k-space line data representative of successive individual image slices.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures:

FIG. 6A shows motion sensitivity of conventional consecutive-slice image data acquisition in comparison with the FIG. 6B relatively motion insensitive image data acquisition using consecutive-segment GRAPPA reference scan acquisition, according to some embodiments of the present invention.

DETAILED DESCRIPTION OF THE INVENTION

The following disclosure describes the present invention according to several embodiments directed at accelerating segmented magnetic resonance (MR) echo-planar image data acquisition by acquiring consecutive segments of k-space line data representative of an individual image slice consecutively in a gradient echo method. The invention is particularly well-suited to image data acquisitions where an accelerated parallel method such as a GRAPPA (Generalized Autocalibrating Partially Parallel Acquisition) is used. However, one skilled in the art would recognize that the techniques described herein may be applicable to various domains where segmented magnetic resonance image data acquisition is performed.

Figure 1:
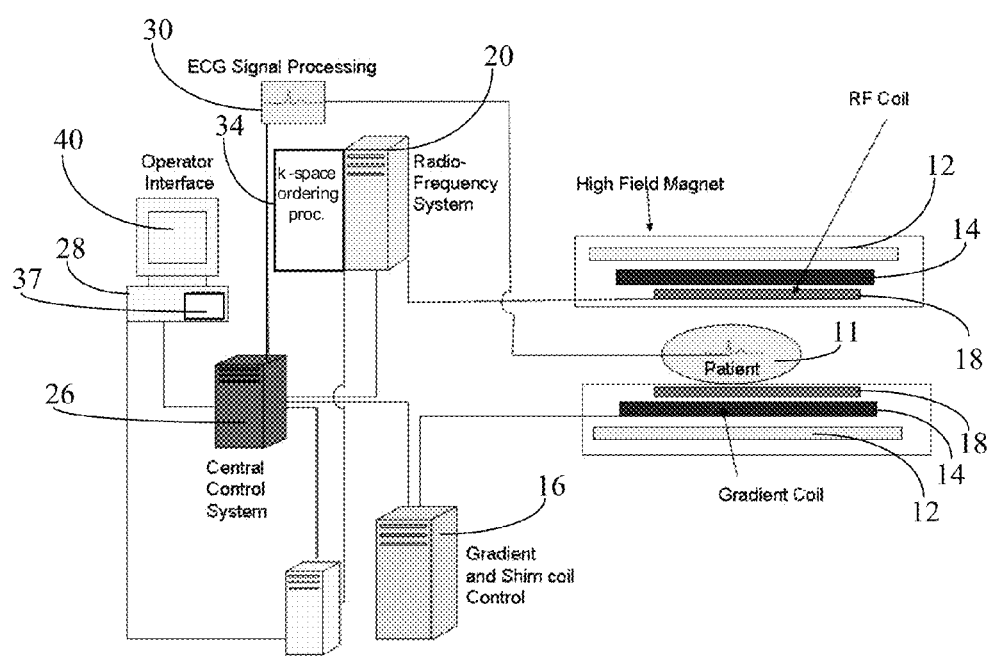
FIG. 1 is a system diagram of a system for accelerated segmented magnetic resonance (MR) image data acquisition, according to some embodiments of the present invention.

FIG. 1 shows system 10 for accelerated segmented magnetic resonance (MR) image data acquisition. System 10 minimizes a time interval between acquisition of adjacent segments in EPI reference lines to advantageously reduce artifacts in image reconstruction. System 10 minimizes this time interval while maintaining an echo spacing that is matched to image acquisition. The time interval is minimized by acquiring the EPI segments in a consecutive-segment manner rather than the conventional consecutive-slice manner. System 10 alters RF pulse excitation flip angles for each segment for gradient-echo or spin-echo EPI acquisitions, for example. The inventors have advantageously recognized that minimizing the time interval between acquisition of adjacent segments in accelerated imaging reference lines reduces artifacts in image reconstruction.

In system 10, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent, and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field, and a readout gradient magnetic field that are applied to patient 11.

Further, RF (radio frequency) module 20 provides RF pulse signals to RF coils 18, which in response produce magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence control module 16 in conjunction with RF module 20 as directed by central control system 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coils 18 receive MR signals, i.e., signals from the excited protons within the body as they return to an equilibrium position established by the static and gradient magnetic fields. The MR signals are detected and processed by a detector within RF module 20 and k-space component processor unit 34 to provide image representative data to an image data processor in central control system 26. ECG synchronization signal generator 30 provides ECG signals used for pulse sequence and imaging synchronization. A two or three dimensional k-space storage array of individual data elements in unit 34 stores corresponding individual frequency components comprising an MR dataset.

An RF (Radio Frequency) signal generator comprising module 20 and RF coils 18 generates RF excitation pulses in anatomy of patient 11 and enables subsequent acquisition of associated RF echo data. A magnetic field gradient generator (comprising magnetic coils 12 and 14) generates a magnetic field for use in acquiring multiple individual frequency components corresponding to magnetic field gradients for anatomical slice selection, phase encoding, and readout RF data acquisition in a three dimensional (3D) anatomical volume.

The RF signal generator units 18 and 20 and the magnetic field gradient generator units 12 and 14 acquire, consecutive segments of k-space line data representative of an individual image slice in a gradient echo method by adaptively varying RF excitation pulse flip angle between acquisition of consecutive segments.

Continuing with respect to FIG. 1, central control unit 26 uses information stored in an internal database to process the detected MR signals in a coordinated manner to generate high quality images of a selected slice (or slices) of the body and adjusts other parameters of system 10. The stored information comprises predetermined pulse sequence and magnetic field gradient and strength data as well as data indicating timing, orientation and spatial volume of gradient magnetic fields to be applied in imaging. Generated images are presented on display 40. Computer 28 includes a graphical user interface (GUI) enabling user interaction with central controller 26 and enables user modification of magnetic resonance imaging signals in real time or near real time. Display processor 37 processes the magnetic resonance signals to provide image representative data for display on display 40, for example.

Figure 2A:
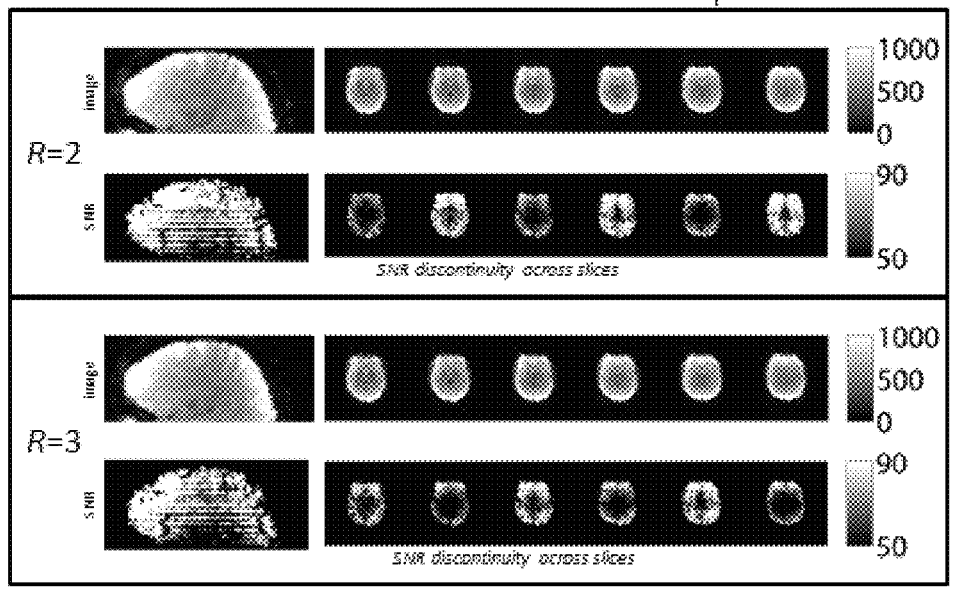
FIG. 2A shows image Signal to Noise Ratio (SNR) maps with acceleration factors R=2 and R=3 comprising accelerated images reconstructed with GRAPPA using a conventional consecutive-slice reference line acquisition.
Figure 2B:
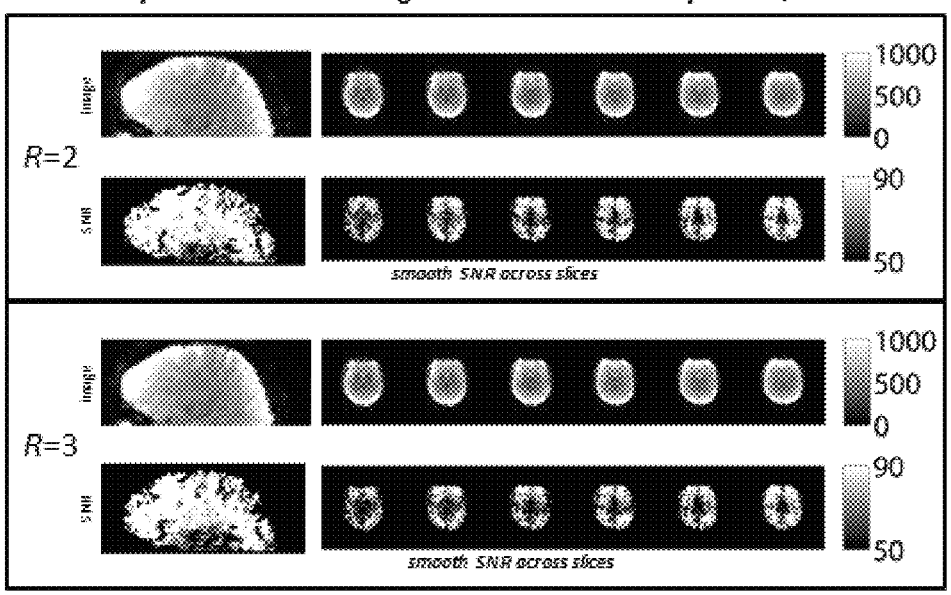
FIG. 2B shows image SNR maps reconstructed with GRAPPA using a multi-shot consecutive-segment reference line acquisition, according to some embodiments of the present invention.

FIG. 2A shows image Signal to Noise Ratio (SNR) maps with acceleration factors R=2 and R=3 comprising accelerated images reconstructed with GRAPPA using a conventional multi-shot consecutive-slice reference line acquisition. FIG. 2B shows image SNR maps reconstructed with GRAPPA using a multi-shot consecutive-segment reference line acquisition. FIGS. 2A and 2B illustrate the effect of segmented k-space reference line acquisitions on image Signal to Noise Ratio (SNR). The figures show MR images reconstructed using GRAPPA with reference lines acquired using two different segmentation schemes. A segment of k-space is a subset of k-space data, and a segmented acquisition is one in which the k-space data for an image is broken up into multiple segments acquired in multiple passes (with one segment acquired per shot). Segmented imaging is also used in cardiac applications and in this case it is typical for one segment to be acquired in each heart cycle in order to reduce motion artifacts in the final image; this may require synchronization to a measurement of a cardiac waveform. Segmented acquisition herein is used in functional brain imaging to reduce geometric distortions in the image by reducing vulnerability to macroscopic magnetic susceptibility gradients in the head (e.g., around air-tissue interfaces such as found above the frontal sinuses), for example.

FIG. 2A shows image degradation and SNR loss due to an acquisition time interval between segments of the conventional consecutive-slice reference acquisition resulting in a SNR profile that is discontinuous across slices. In contrast, FIG. 2B shows a consecutive-segment reference line acquisition yields a continuous SNR profile across slices as well as an overall SNR increase.

Figure 3A:
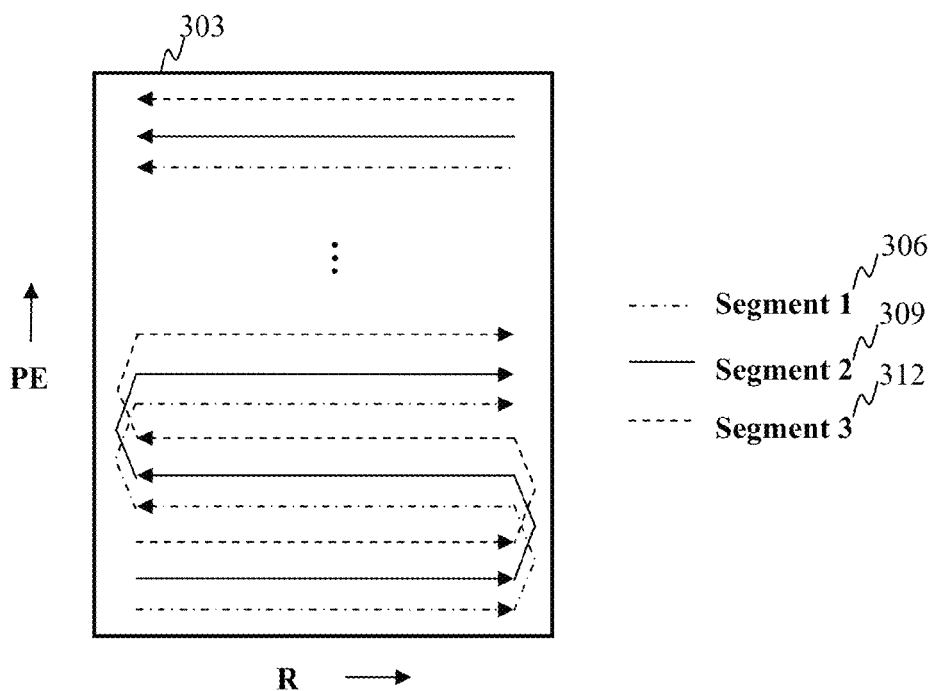
FIGS. 3A and 3B illustrate different k-space acquisition methods for acquisition of 3 segments, according to some embodiments of the present invention.
Figure 3B:
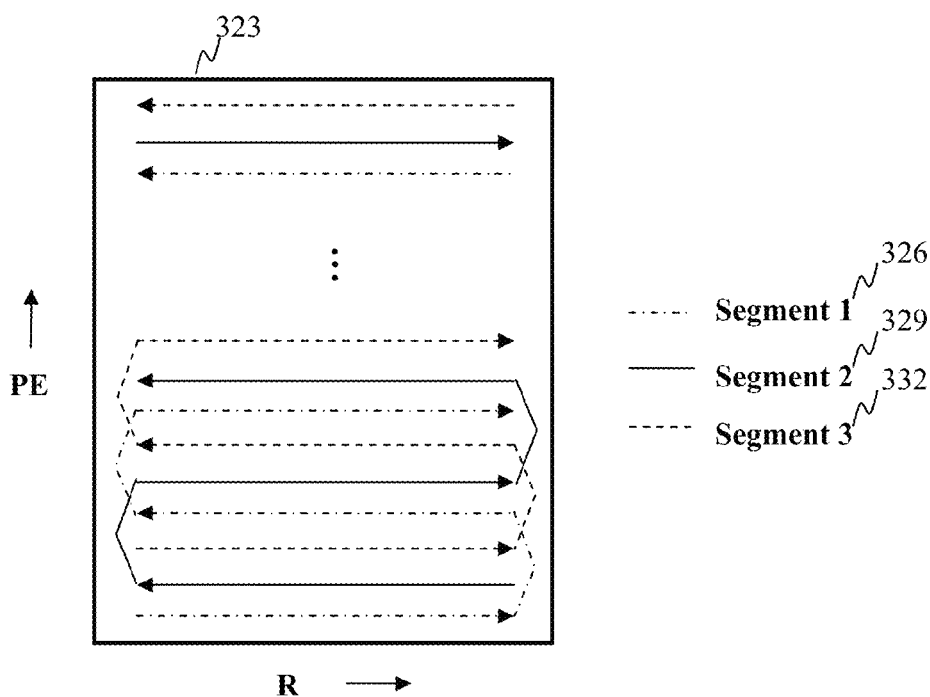

FIGS. 3A and 3B provide illustrations of different k-space acquisition methods for acquisition of 3 segments. This figures show two k-space acquisition embodiments of a single slice, specifically phase encoding versus readout plane 303, for 3 segments 306, 309 and 312 and plane 323 for segments 326, 329 and 332, each comprising a reference line acquisition using a 3-shot acquisition, as an example. The three EPI segments 306, 309, 312 and 326, 329 332 are acquired consecutively for each respective image slice. In one embodiment, for odd numbers of segments, alternate segments are acquired in a reversed polarity (as shown in FIG. 3B) in order to ensure that any mis-alignment between segments results in a Nyquist-like N/2 ghost. This acquisition method may be applied to either gradient-echo or spin-echo EPI acquisitions by changing RF excitation pulse flip angles and timing between the pulses, as shown in FIGS. 4 and 5 respectively.

Figure 4:
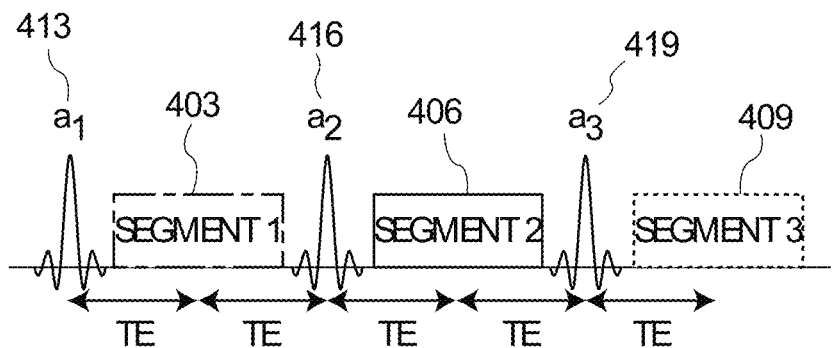
FIG. 4 provides an example of a pulse sequence for acquisition of 3 segments with a gradient echo EPI variant, as used in some embodiments of the present invention.

FIG. 4 shows a pulse sequence for acquisition of 3 segments 403, 406, 409 with a gradient echo EPI variant. For the gradient-echo acquisition, in one embodiment, the flip angles are calculated such that the signal is equal across segments. To perform this calculation, any expression known in the art for such a variation of flip angles may be used. In this 3-shot case, the flip angles are 35.1 degrees 413 for segment 1 ($\alpha_1$), 45 degrees 416 for segment 2 ($\alpha_2$) and 90 degrees 419 for segment 3 ($\alpha_3$). Flip angle values are calculated using a formula that takes into account the T1 value of the tissue and the time interval between the RF pulses. The formula helps to ensure that there is equal magnetization across segments.

Figure 5:
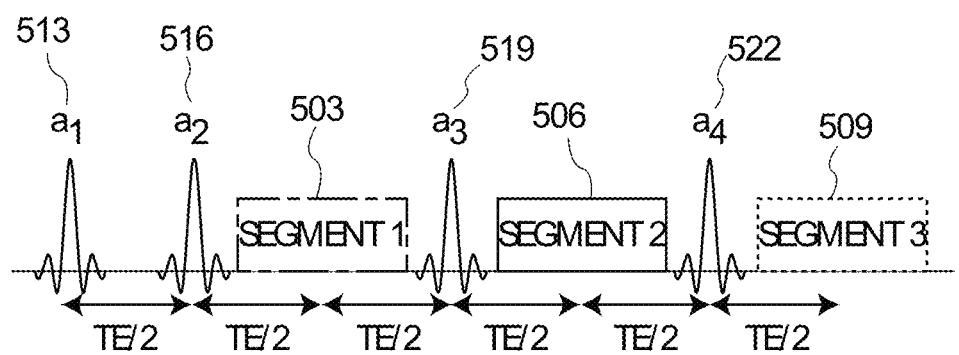
FIG. 5 is an illustration of a pulse sequence for acquisition of 3 segments with a spin echo EPI variant, according to some embodiments of the present invention.

FIG. 5 shows a pulse sequence for acquisition of 3 segments 503, 506, 509 with a spin echo EPI variant. For this spin-echo case, a flip angle arrangement comprises, for example, a first excitation pulse of 90 degrees ($\alpha_1$) 513, followed by 180 degrees refocusing pulses ($\alpha_2$ 516, $\alpha_3$ 519, $\alpha_4$ 522) to form spin-echoes for each segment. A consecutive segment reference line acquisition for the gradient-echo and spin-echo cases differs in the flip angles used for each segment and in the timings between the pulses to achieve the desired echo times. For each case, a GRAPPA kernel is computed from fully-sampled k-space data resulting from combined data across the multiple segments. For a general N-shot acquisition, N different flip angles may be applied.

In some cases where the T1 values of the tissues being imaged are spatially heterogeneous or a flip angle achieved by the MRI system is spatially non-uniform, some artifacts can occur. In one embodiment, these effects are mitigated by setting N flip angles to a small value such as, for example, 5 degrees. All N flip angles may be set to the identical small value, or the value of each of the N flip angle may be substantially identical (e.g., each angle within less than 1 degree of each other). Larger values (e.g., 20 degrees) may also be used for N flip angles with a small number of "dummy" RF pulses played immediately before acquisition in order to bring the tissue into a steady state that matches the state during a segmented acquisition. In one embodiment, the values for the N flip angles vary and are calculated with a formula that produces 35, 45, 90 degrees for the case of three shots, a short TR, and a long T1. In another embodiment, the values for the N flip angles are substantially the same (e.g., within less than 1 degree) and dummy pulses are used. In other embodiments a 90-180-180 degree RF pulse flip angles are used. In a gradient echo case, flip angle values are adjusted to account for imperfections in a slice select pulse profile. In a spin echo case, the flip angle values are lowered in order to reduce SAR deposition.

FIG. 6A shows motion sensitivity of conventional consecutive-slice image data acquisition. For comparison, FIG. 6B shows relatively motion insensitive image data acquisition using consecutive-segment GRAPPA reference scan acquisition, according to some embodiments of the present invention. In order to assess motion sensitivity, the FIGS. 6A and 6B image data of row 605 are acquired on a mechanical motion phantom which includes an anthropomorphic brain phantom undergoing continuous nodding motion around a Right-Left axis during image data acquisition. For the case of row 603 without motion, the methods of the conventional consecutive-slice reference acquisition system and the consecutive-segment reference acquisition of system 10 give similar results. For the case with motion (row 605), the methods of the conventional system result in significant ghosting artifacts and a lower SNR (Signal to Noise Ratio) compared with the system 10 consecutive-slice method. The advantageous consecutive-segment method gives similar results with and without motion demonstrating the robustness of this method to subject motion.

In addition to its use for acquiring GRAPPA reference data in a beginning of an EPI scan, a system 10 acquisition method may also be applied to acquiring image data as well as reference data. Similar to a TGRAPPA (Temporal GRAPPA) acquisition, for an N-shot acquisition, a fully sampled k-space is acquired every N measurement. A GRAPPA kernel is calculated and updated dynamically during the acquisition, which compensates for changes in head position or slowly varying physiological changes that accrue during a scan. Alternatively, data from the same N shots may be combined into a single fully-sampled k-space that is reconstructed using any reconstruction method known in the art. However, this may provide an overall lower temporal sampling rate.

Applications of system 10 include diffusion MRI, where for a typical multi-shot reference line acquisition method, a time interval between segments may be as high as, for example, 25 to 30 seconds for clinically relevant scan protocols. Another application is functional MRI, where image artifacts and discontinuous SNR may contaminate subtle functional activations that are detected in the data. For this application, either the gradient-echo variant of the reference line acquisition is used for gradient-echo EPI imaging and the spin-echo variant for spin-echo imaging, or alternatively a spin-echo reference line acquisition is used for gradient-echo image acquisition in order to reduce potential artifacts caused by image intensity drop out caused by magnetic susceptibility-induced dephasing. Another application where EPI acquisitions are employed is perfusion MRI, either with contrast agent (e.g., Dynamic Susceptibility Contrast methods) or without (e.g., arterial spin labeling methods).

A difference in timing can be seen between the methods of FIGS. 4 and 5. The echo time, TE, is set for a given imaging protocol to achieve the desired image contrast. This value typically ranges from 10 ms to 250 ms, depending on the clinical application. Whatever the desired TE might be to achieve a specific image contrast, the timing for the calibration scans acquired is adapted by the system to this TE. Alternatively, TE for the reference scan can be set to any arbitrary value with the minimum value being dependent on the desired spatial resolution and readout bandwidth.

Figure 7:
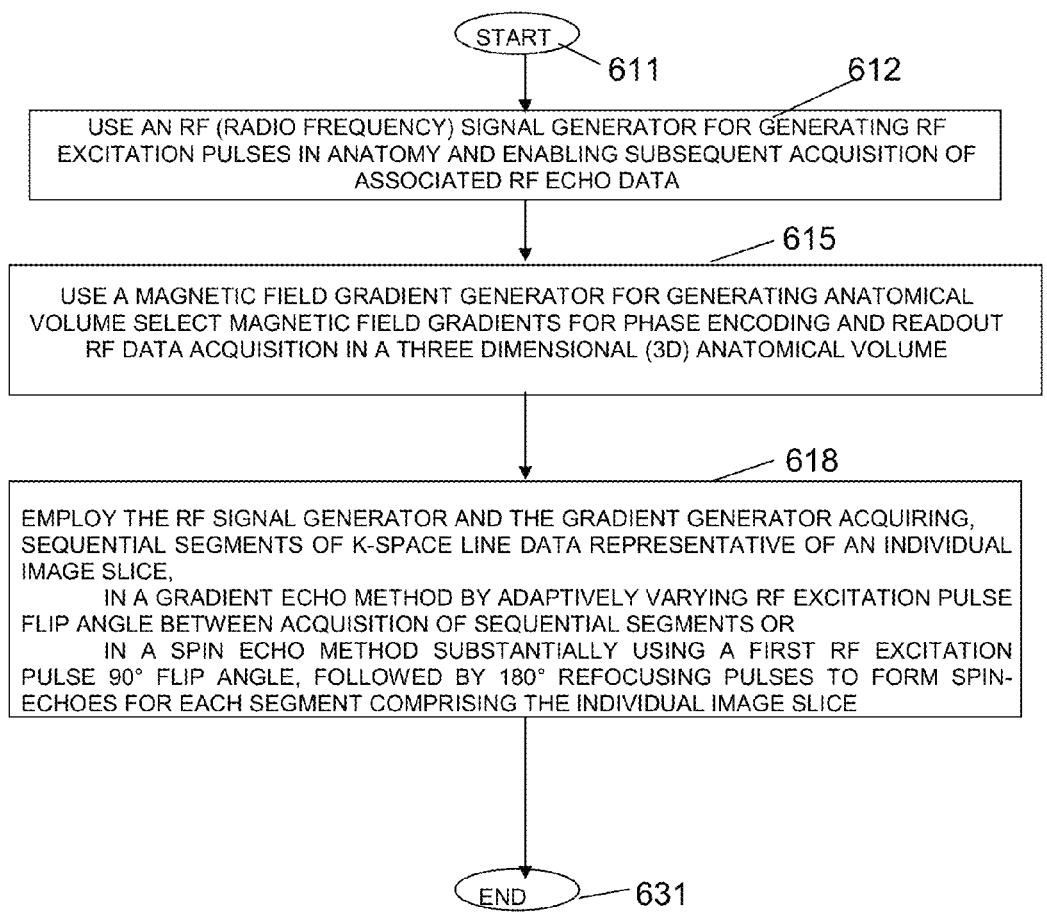
FIG. 7 illustrates a flowchart of a process performed by a system for accelerated segmented magnetic resonance (MR) image data acquisition, according to some embodiments of the present invention

FIG. 7 shows a flowchart of a process performed by system 10 (FIG. 1) for accelerated segmented magnetic resonance (MR) image data acquisition, according to some embodiments of the present invention. In step 612 following the start 611, an RF (Radio Frequency) signal generator (e.g., units 18 and 20) generates RF excitation pulses in anatomy and enables subsequent acquisition of associated RF echo data. In step 615, a magnetic field gradient generator (e.g., units 12 and 14) generates magnetic field gradients for anatomical volume selection, phase encoding and readout RF data acquisition in a three dimensional (3D) anatomical volume. In step 618, the RF signal generator and the magnetic field gradient generator acquire consecutive segments of k-space line data representative of an individual image slice in a gradient echo method by adaptively varying RF excitation pulse flip angle between acquisition of consecutive segments. In one gradient echo embodiment, the RF signal generator provides three RF pulses of varying RF excitation pulse flip angle for acquisition of three consecutive segments comprising the individual image slice, the RF excitation pulse flip angle comprising flip angles of 35.1 degrees for segment 1, 45 degrees for segment 2, and 90 degrees for segment 3. The system may advantageously calculate flip angle for acquisition of the consecutive segments so that applied RF excitation signal is substantially equal for acquisition of the different segments comprising the consecutive segments. The term "substantially equal," when used in reference to RF excitation signals, refers to the resulting magnetization following the RF excitation signals which are detected and sampled are either equal in their magnetization value or within a minimal percentage difference of each other. For example, in one embodiment, two RF excitation signals are "substantially the same" if the difference between the two signals is less than 5%.

In another gradient echo embodiment, the RF signal generator and the magnetic field gradient generator acquire consecutive segments of k-space line data representative of an individual image slice in a gradient echo method by using substantially the same flip angle for acquisition of consecutive segments. The term "substantially the same," when used in reference to the flip angle, refers to flip angles which are either identical or within a small number of degrees of each other. For example, in one embodiment, two flip angles are "substantially the same" if the difference between the two angles is less than 1 degree.

Alternatively, the RF signal generator and the magnetic field gradient generator may acquire consecutive segments of k-space line data representative of an individual image slice in a spin echo method using a first RF excitation pulse 90° flip angle, followed by 180° refocusing pulses to form spin-echoes for each segment comprising said individual image slice.

In some embodiments, the RF signal generator and the gradient generator acquire the consecutive segments comprising consecutive segments of calibration k-space line data of successive consecutive individual image slices in a parallel imaging method. The calibration k-space line data and parallel imaging method includes auto-calibration k-space line data of a GRAPPA (Generalized Autocalibrating Partially Parallel Acquisition) accelerated parallel imaging method. In one embodiment, the consecutively acquired segments of calibration k-space line data are consecutive for the individual image slice and interleaved in k-space. The process of FIG. 7 terminates at step 631.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting, or transmitting information for use by an executable procedure or an information device, and/or by routing the information to an output device. A processor may use or comprise the capabilities of a computer, controller, or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is an element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instructions, sub-routine, or other distinct section of code or portion of an executable application for performing one or more particular processes. These processes may include receiving input data and/or parameters; performing operations on received input data and/or performing functions in response to received input parameters; and providing resulting output data and/or parameters. A graphical user interface (GUI), as used herein, comprises one or more display images (e.g., generated by a display processor) and enabling user interaction with a processor or other device, associated data acquisition, and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen, or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps described herein may be performed automatically or wholly or partially in response to user command. An activity (including a step) performed automatically is performed in response to executable instruction or device operation without user direct initiation of the activity.

Terms and Concepts Associated with Some Embodiments

EPI means Echo planar imaging involves image acquisition whereby a complete image is formed from a single data sample (k-space lines are acquired in one repetition time) of a gradient echo or spin echo sequence.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted). Adiabatic IR pulses are used to give more uniform contrast throughout an imaging volume than non-adiabatic RF pulses.

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI comprises inversion time, the time between an inversion recovery pulse and the next RF excitation pulse. TI determines the image contrast.

$T_1$ comprises the longitudinal (or spin-lattice) relaxation time $T_1$ decay constant.

$T_2$ comprises the transverse (or spin-spin) relaxation time $T_2$ is the decay constant for a proton spin component.

TR comprises repetition time, the time between successive RF excitation pulses.

FA comprises flip angle, i.e., an RF flip angle. For an inversion pulse, FA=180 degrees.

A saturation pulse (or saturation recovery pulse) comprises an RF pulse, typically 90 degrees (or any odd multiple of 90 degrees). Some systems use a spoiler gradient after the RF pulse. In a particular type of partial saturation pulse sequence a preceding pulse leaves the spins in a state of saturation, so that recovery at the time of the next pulse has taken place from an initial condition of no magnetization.

Adiabatic RF pulses include RF amplitude and frequency modulated pulses that are insensitive to the effects of B1-inhomogeneity and frequency offset (conventional RF pulses used in MRI are only amplitude modulated).

RF refocusing pulse include A radio frequency (RF) refocusing (or rephasing) pulse returns spins to the same starting phase that they had after an initial excitation RF pulse (an excitation RF pulse brings the magnetization from the longitudinal direction into the transverse plane). At the time point when the spins have reached the same starting phase, the available signal is maximal. That is the time point where the so-called "spin echo" occurs. By repeatedly playing the RF refocusing pulses (the BIREF-1 pulses) the magnetization is repeatedly refocused leading to repeated spin echoes. The peak amplitude of each of the spin echoes is on the T2-decay curve. Without using refocusing pulses, the signal would decay much faster with the T2* (T2 star) curve after the initial excitation RF pulse.

Spoiler gradient means a magnetic field gradient pulse applied to effectively remove transverse magnetization of a field coil by producing a rapid variation of its phase along the direction of the gradient. For the T2prep module it is played after the 90 degrees flip back (also known as tip up) pulse has been played. It destroys remaining transverse magnetization so that after playing the entire T2prep module magnetization is again in the longitudinal direction.

Segmented data acquisition records the different parts of raw data space (the segments) in a periodic fashion by repeatedly playing out a pulse sequence comprising an excitation, inversion, or refocusing pulse sequence and MR data acquisition pulses and acquiring a different set of k-space lines during readout (acquisition). FIG. 1 shows an exemplary timing diagram of such a segmented sequence (gated using an ECG trigger in some embodiments), and indicating how the data is placed to the raw data space.

B0 is the main static base MRI magnetic field.

B1 is the RF transmit coil field.

The system and processes of FIGS. 1-7 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system acquires EPI segments in a consecutive-segment manner and alters RF pulse excitation flip angles for each segment for gradient-echo or spin-echo EPI acquisitions to minimize a time interval between acquisition of adjacent segments in EPI reference lines while maintaining an echo spacing that is matched to image acquisition. Further, the processes and applications may, in alternative embodiments, be located on one or more (e.g., distributed) processing devices on a network linking the units of FIG. 1. Any of the functions and steps provided in FIGS. 1-7 may be implemented in hardware, software or a combination of both. No claim element herein is to be construed under the provisions of 35 U.S.C. 112, sixth paragraph, unless the element is expressly recited using the phrase "means for."

What is claimed:

1. A system for accelerated segmented magnetic resonance (MR) image data acquisition, comprising:
    an RF (Radio Frequency) signal generator for generating RF excitation pulses in anatomy and enabling subsequent acquisition of associated RF echo data; and
    a magnetic field gradient generator for generating magnetic field gradients for anatomical volume selection, phase encoding, and readout RF data acquisition in a three dimensional (3D) anatomical volume,
    wherein said RF signal generator and said magnetic field gradient generator are configured to acquire temporally consecutive segments of k-space line data representative of a first individual image slice in a gradient echo method by adaptively varying an RF excitation pulse flip angle between acquisition of the temporally consecutive segments before acquiring temporally consecutive segments of k-space line data representative of a second individual image slice, and
    wherein the adaptive variation of the RF excitation pulse flip angles is calculated to provide an equal magnetization across segments.

2. The system according to claim 1,
    wherein said temporally consecutive segments comprise temporally consecutive segments of calibration k-space line data, and
    wherein said RF signal generator and said magnetic field gradient generator are further configured to acquire said temporally consecutive segments using a parallel imaging technique.

3. The system according to claim 2, wherein
    said RF signal generator and said magnetic field gradient generator are further configured to acquire additional temporally consecutive segments of calibration k-space line data representative of successive individual image slices.

4. The system according to claim 2, wherein
    said RF signal generator and said magnetic field gradient generator are further configured to acquire additional temporally consecutive segments of calibration k-space line data representative of successive individual image slices.

5. The system according to claim 2,
    wherein said parallel imaging technique is a GRAPPA (Generalized Autocalibrating Partially Parallel Acquisition) accelerated parallel imaging technique, and
    wherein said calibration k-space line data comprises autocalibration k-space line data of the GRAPPA accelerated parallel imaging technique.

6. The system according to claim 2, wherein
    said temporally consecutive segments of calibration k-space line data are temporally consecutive for said individual image slice and interleaved in k-space.

7. The system according to claim 1, wherein
    said RF signal generator is further configured to provide three RF pulses of varying RF excitation pulse flip angles for acquisition of three temporally consecutive segments comprising said individual image slice, said RF excitation pulse flip angles comprising flip angles of 35.1 degrees for segment 1, 45 degrees for segment 2, and 90 degrees for segment 3.

8. The system according to claim 1, wherein
said system is configured to provide the RF excitation pulse flip angles for acquisition of said temporally consecutive segments such that an applied RF excitation signal is substantially equal for acquisition of each temporally consecutive segment included in said temporally consecutive segments.

9. A system for accelerated segmented magnetic resonance (MR) image data acquisition, comprising:
an RF (Radio Frequency) signal generator for generating RF excitation pulses in anatomy and enabling subsequent acquisition of associated RF echo data; and
a magnetic field gradient generator for generating magnetic field gradients for anatomical volume selection, phase encoding and readout RF data acquisition in a three dimensional (3D) anatomical volume,
wherein said RF signal generator and said magnetic field gradient generator are configured to acquire temporally consecutive segments of k-space line data representative of a first individual image slice using a spin echo technique comprising a first RF excitation pulse producing a 90 degree flip angle, followed by 180 degree refocusing pulses to form spin-echoes for each segment comprising said individual image slice before acquiring temporally consecutive segments of k-space line data representative of a second individual image slice.

10. The system according to claim 9,
wherein said temporally consecutive segments comprise temporally consecutive segments of calibration k-space line data, and
wherein said RF signal generator and said magnetic field gradient generator are configured to acquire said temporally consecutive segments using a parallel imaging technique.

11. The system according to claim 10, wherein
said RF signal generator and said magnetic field gradient generator are further configured to acquire additional temporally consecutive segments of calibration k-space line data of successive individual image slices.

12. The system according to claim 10, wherein
said RF signal generator and said magnetic field gradient generator are further configured to acquire additional temporally consecutive segments of calibration k-space line data of successive individual image slices.

13. The system according to claim 11, wherein
wherein said parallel imaging technique is a GRAPPA (Generalized Autocalibrating Partially Parallel Acquisition) accelerated parallel imaging technique, and
wherein said calibration k-space line data comprises autocalibration k-space line data of the GRAPPA accelerated parallel imaging technique.

14. The system according to claim 11, wherein
said temporally consecutive segments of calibration k-space line data are temporally consecutive for said individual image slice and interleaved in k-space.

15. A system for accelerated segmented magnetic resonance (MR) image data acquisition, comprising:
an RF (Radio Frequency) signal generator for generating RF excitation pulses in anatomy and enabling subsequent acquisition of associated RF echo data; and
a magnetic field gradient generator for generating magnetic field gradients for anatomical volume selection, phase encoding and readout RF data acquisition in a three dimensional (3D) anatomical volume,
wherein said RF signal generator and said magnetic field gradient generator are configured to acquire temporally consecutive segments of k-space line data representative of a first individual image slice using a gradient echo technique comprising a substantially identical flip angle value for acquisition of said temporally consecutive segments of k-space line data representative of the same individual slice before acquiring temporally consecutive segments of k-space line data representative of a second individual image slice.

16. The system according to claim 15,
wherein said temporally consecutive segments comprise temporally consecutive segments of calibration k-space line data, and
wherein said RF signal generator and said magnetic field gradient generator are further configured to acquire said temporally consecutive segments using a parallel imaging technique.

17. The system according to claim 16, wherein
said RF signal generator and said magnetic field gradient generator are further configured to acquire additional temporally consecutive segments of calibration k-space line data representative of successive individual image slices.

18. A method for accelerated segmented magnetic resonance (MR) image data acquisition, comprising:
acquiring temporally consecutive segments of k-space line data representative of a first individual image slice using a gradient echo technique by adaptively varying RF excitation pulse flip angles between acquisition of said temporally consecutive segments before acquiring temporally consecutive segments of k-space line data representative of a second individual image slice,
wherein said acquiring is performed using an RF (Radio Frequency) signal generator configured to generate RF excitation pulses in anatomy and enable subsequent acquisition of associated RF echo data, and further using a magnetic field gradient generator configured to generate magnetic field gradients for anatomical volume selection, phase encoding and readout RF data acquisition in a three dimensional (3D) anatomical volume, and
wherein the adaptive variation of the RF excitation pulse flip angles is calculated to provide an equal magnetization across segments.

19. The method according to claim 18,
wherein said temporally consecutive segments comprise temporally consecutive segments of calibration k-space line data, and
wherein said RF signal generator and said magnetic field gradient generator acquire said temporally consecutive segments using a parallel imaging technique.

20. The method according to claim 19, further comprising:
acquiring additional temporally consecutive segments of calibration k-space line data representative of successive individual image slices using said RF (Radio Frequency) signal generator and said magnetic field gradient generator.

* * * * *